United States Patent [19]
Furuyama

[11] Patent Number: 5,148,393
[45] Date of Patent: Sep. 15, 1992

[54] MOS DYNAMIC SEMICONDUCTOR MEMORY CELL

[75] Inventor: Tohru Furuyama, Tokyo, Japan

[73] Assignee: Kabushiki Kaisha Toshiba, Kawasaki, Japan

[21] Appl. No.: 375,909

[22] Filed: Jul. 6, 1989

[30] Foreign Application Priority Data

Jul. 7, 1988 [JP] Japan ................... 63-169930

[51] Int. Cl.[5] ................. G11C 7/00; G11C 11/407
[52] U.S. Cl. ................. 365/149; 365/189.09; 307/296.1
[58] Field of Search ........... 365/189.09, 181, 190, 365/226; 307/296.1, 296.2

[56] References Cited

U.S. PATENT DOCUMENTS

| | | | |
|---|---|---|---|
| 4,259,729 | 3/1981 | Tokushige | 365/149 |
| 4,296,340 | 10/1981 | Horan | 307/296.2 X |
| 4,791,317 | 12/1988 | Winnerl et al. | 307/296.2 |
| 4,802,123 | 1/1989 | Togita | 365/189.09 X |
| 4,817,055 | 3/1989 | Arakawa et al. | 307/296.2 X |
| 4,862,415 | 8/1989 | Nakano | 365/190 X |
| 4,864,373 | 9/1989 | Miyashita | 307/296.2 X |
| 4,873,668 | 10/1989 | Winnerl et al. | 307/296.1 X |

FOREIGN PATENT DOCUMENTS

| | | |
|---|---|---|
| 0031238 | 7/1981 | European Pat. Off. |
| 0062894 | 10/1982 | European Pat. Off. .......... 307/296.2 |
| 0157051 | 10/1985 | European Pat. Off. |
| 56-88354 | 7/1981 | Japan |

*Primary Examiner*—Alyssa H. Bowler
*Attorney, Agent, or Firm*—Finnegan, Henderson, Farabow, Garrett and Dunner

[57] ABSTRACT

A semiconductor memory according to the present invention comprises a MOS dynamic semiconductor memory cell in which one terminal of a current path of one MOS transistor is connected to one capacitor element, the other terminal of the current path of the MOS transistor is connected to a bit line, and a gate electrode of the transistor is connected to a word line, wherein a substrate of the MOS transistor is not connected to a fixed potential terminal, and the potential of the substrate is switched and controlled so that the MOS transistor time-selectively becomes an enhancement type or a depletion type which can prevent a threshold voltage loss over time.

11 Claims, 3 Drawing Sheets

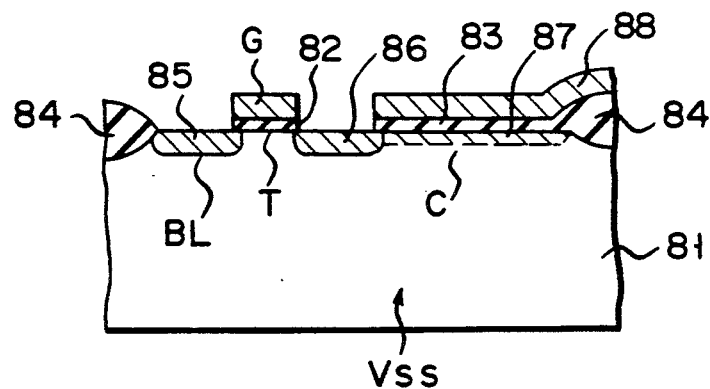
FIG. 1 (PRIOR ART)
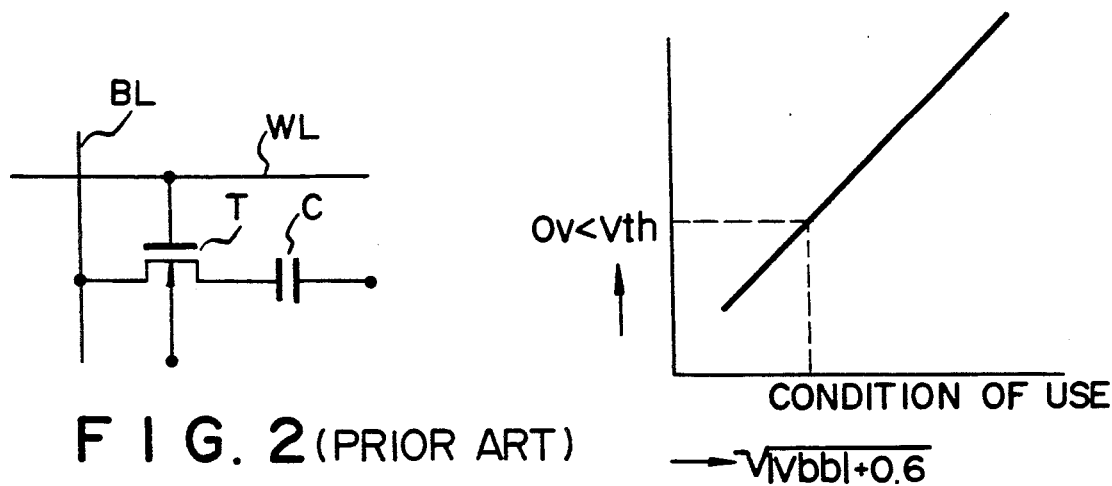
FIG. 2 (PRIOR ART)
FIG. 3 (PRIOR ART)
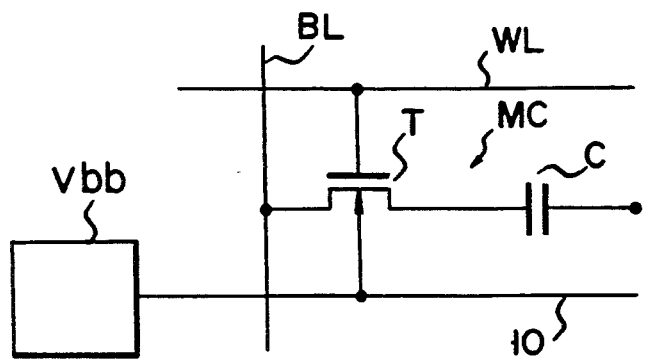
FIG. 4

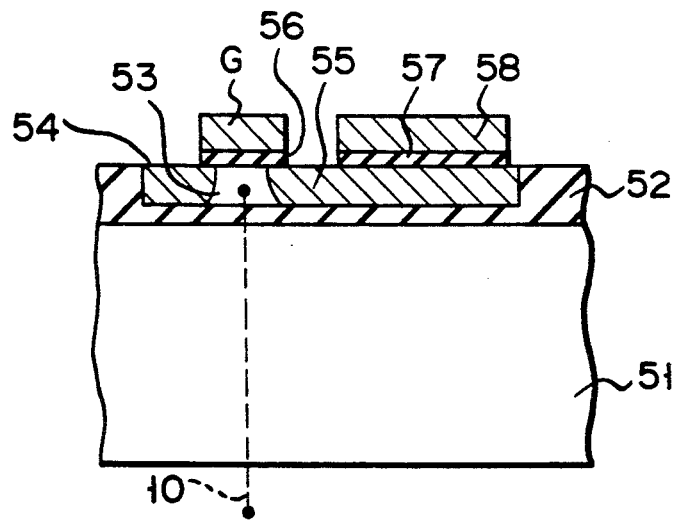
F I G. 8
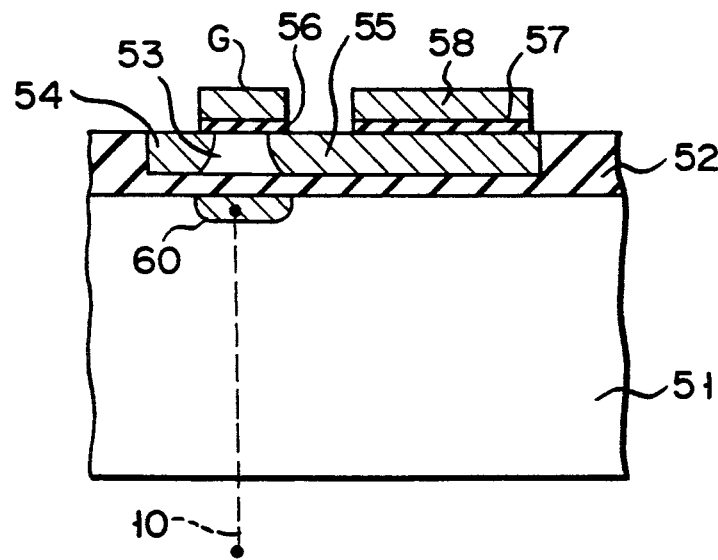
F I G. 9
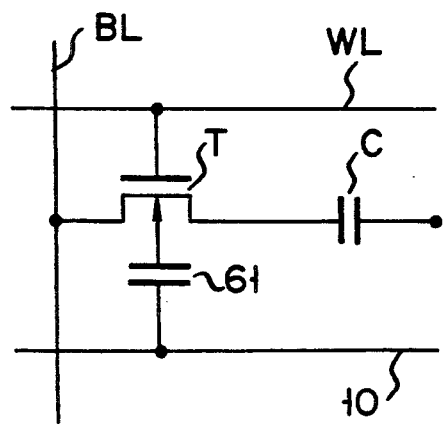
F I G. 10

MOS DYNAMIC SEMICONDUCTOR MEMORY CELL

BACKGROUND OF THE INVENTION

1. Field of the Invention

The present invention relates to a MOS dynamic semiconductor memory cell used in an insulating gate type dynamic random access memory or the like and a semiconductor memory including an array of the memory cells.

2. Description of the Related Art

A conventional MOS dynamic memory cell is shown in FIGS. 1 and 2. In FIGS. 1 and 2, one transfer gate MOS transistor (e.g., an n-channel type) T is connected in series with one capacitor element C. Reference numeral 81 denotes a p-type semiconductor substrate; 82, a gate oxide film; 83, a capacitor insulating film; 84, an element isolation region; 85 and 86, drain and source n-type impurity layers; 87, an n-type impurity layer for electric charge storage; 88, a capacitor electrode consisting of polysilicon; and G, a gate electrode consisting of polysilicon.

In the memory cell shown in FIGS. 1 and 2, the gate electrode G is connected to a word line WL, and the drain n-type impurity layer 85 is connected to a bit line BL. The semiconductor substrate 81 has a fixed potential common to that of each memory cell and, normally, has a power source potential Vss of the semiconductor memory or a negative potential generated in the semiconductor integrated memory. This fixed potential is not changed except when, e.g., noise adversely affects this potential.

As described above, an n-channel type MOS transistor having a fixed substrate potential serves an enhancement type MOS transistor. FIG. 3 shows a typical relationship between a threshold voltage Vth and a substrate potential Vbb of the enhancement type MOS transistor. Within a range of the substrate potential Vbb used in practice, Vth >0 V. Therefore, in order to write data up to the limit level (normally, power source voltage Vcc) of the logical amplitude of the bit lines a voltage boosted (bootstrap) to (Vcc +Vth) or more must be applied to the word line and the MOS transistor must be turned on in a triode region to prevent a threshold voltage loss caused by this MOS transistor. In addition, when the bit line is high, the Vth value is higher than that when the bit line is low, because of the back-gate bias effect. The boosted level of the word line must exceed (Vcc +Vth) where the Vth value is defined when the bit line is high.

When the voltage of the word line is boosted, many problems in, e.g., the operation margin and reliability of the memory cell element are caused along with miniaturization of the memory cell element of the semiconductor memory. In addition, in order to boost the voltage of the word line, a large-sized word line booster having a complicated arrangement is required. Therefore, even if a CMOS circuit is arranged in the semiconductor memory to achieve a simple circuit, a sufficient operation margin, and high reliability, the performance and reliability of the semiconductor memory are considerably degraded due to the need of the boosted voltage of the word line, and an effect of the CMOS circuit is undesirably lost.

SUMMARY OF THE INVENTION

The present invention has been made to solve the following problems. That is, in a MOS transistor of the above-mentioned conventional MOS dynamic memory cell, a substrate potential is fixed, and the voltage of a word line must be boosted in order to write data up to the limit level of the logical amplitude of the bit lines. Therefore, along with miniaturization of the memory cell element of the semiconductor memory, the problems such as an insufficient operation margin of the memory cell element, the degradation of its reliability, and large circuit size are posed. It is an object of the present invention to provide a semiconductor memory cell which can time-selectively switch and control a substrate potential of the MOS transistor, and can switch and control the memory cell characteristics depending on the substrate potential, as needed.

It is another object of the present invention to provide a semiconductor memory which can write data up to the limit level of the logical amplitude of bit lines without boosting the voltage of a word line, so that a word line booster is not required to protect an effect of a CMOS circuit.

A semiconductor memory according to the present invention comprises a MOS dynamic semiconductor memory cell in which one terminal of a current path of one MOS transistor is connected to one capacitor element, the other terminal of the current path of the MOS transistor is connected to a bit line, and a gate electrode of the transistor is connected to a word line, wherein a substrate of the MOS transistor is not connected to a fixed potential terminal, and the potential of the substrate is switched and controlled so that the MOS transistor can avoid the Vth increase due to the back-gate bias effect according to the bit line level, or so that the MOS transistor time-selectively becomes an enhancement type or a depletion type which can prevent a threshold voltage loss over time.

The semiconductor memory according to the present invention comprises a memory cell array of semiconductor memory cells and a circuit means for switching and controlling the potential of a substrate so that the MOS transistor can avoid the Vth increase due to the back-gate bias effect according to the bit line level, or so that a MOS transistor of the memory cell time-selectively becomes an enhancement type or a depletion type which can prevent a threshold voltage loss over time.

According to the present invention, since the substrate of the MOS transistor of the MOS dynamic semiconductor memory cell is not connected to a fixed potential terminal, the substrate potential of the MOS transistor can be time-selectively switched and controlled. Therefore, the memory cell characteristics depending on the substrate potential can be controlled to avoid the Vth increase according to the bit line level, or can be switched and controlled to an enhancement type or a depletion type, as needed.

The semiconductor memory having the above-mentioned memory cell array can time-selectively switch and control the potential of the substrate so that the MOS transistor can avoid the Vth increase due to the back-gate bias effect according to the bit line level, or so that the MOS transistor becomes an enhancement type or a depletion type which can prevent a threshold voltage loss. Therefore, a memory cell selected in response to an address signal can be controlled to avoid the Vth increase or to be of the depletion type. Therefore, the threshold voltage loss of the semiconductor memory cell can be minimized or prevented. Even if the limit level of the logical amplitude of the bit lines is used as an enable voltage of the word line, data can be written up to the limit level of the logical amplitude of the bit lines of the semiconductor memory cell. Therefore, when the semiconductor memory cell is operated, a word line booster is simplified or not required, and the operation margin and reliability of the memory cell element can be improved.

BRIEF DESCRIPTION OF THE DRAWINGS

FIG. 1 is a sectional view of a conventional MOS dynamic memory cell;

FIG. 2 is an equivalent circuit of a conventional MOS dynamic memory cell shown in FIG. 1;

FIG. 3 is a typical relationship between a threshold voltage and a substrate potential of the enhancement type MOS transistor;

FIG. 4 is an equivalent circuit of a MOS dynamic memory cell used in a memory cell array of a C MOS dynamic RAM of an embodiment of this invention;

FIGS. 8 and 9 are sectional views of different embodiments; and

FIG. 10 equivalent circuit of the embodiment shown in FIG. 9.

DETAILED DESCRIPTION OF THE PREFERRED EMBODIMENTS

An embodiment of the present invention will be described hereinafter in detail with reference to the accompanying drawings.

FIG. 4 shows an equivalent circuit of a MOS dynamic memory cell MC used in a memory cell array of a CMOS dynamic RAM. In this memory cell MC, one terminal of a current path of one MOS transistor (e.g., an n-channel type) T is connected to one capacitor element C, the other terminal thereof is connected to a bit line BL, and a gate electrode G is connected to a word line WL. Note that a back gate of the MOS transistor T is connected to a substrate potential line 10, and the substrate potential line 10 is connected to a potential switching device Vbb for time-selectively switching the potential of the substrate potential line 10.

Figure 5:
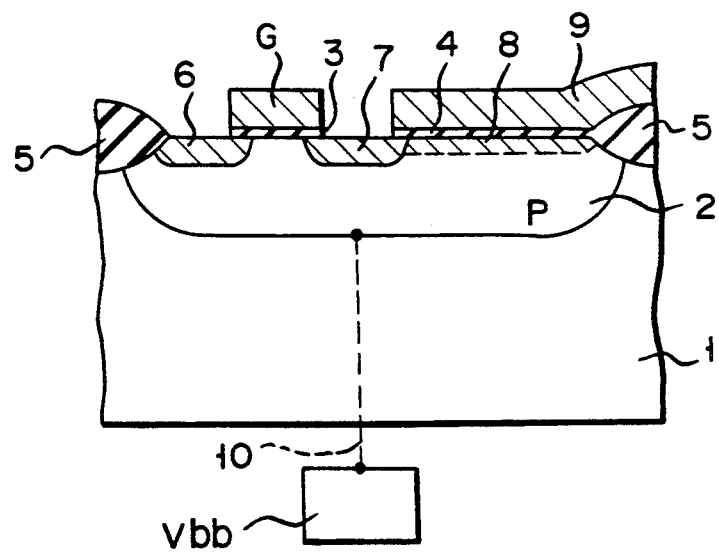
FIG. 5 is an example of a conceptional structure of the memory cell.

FIG. 5 shows an example of a conceptional structure of the memory cell MC. Reference numeral 1 denotes a semiconductor substrate; 2, a p-type substrate layer (well region) formed in a memory cell formation region of the semiconductor substrate 1; 3, a gate oxide film formed on the p-type substrate layer 2; 4, a capacitor insulating film formed on the p-type substrate layer 2; 5, an element isolation region; 6 and 7, drain region and source region n-type impurity layers formed in the p-type substrate layer 2; 8, an n-type impurity layer for electric charge storage formed in the p-type substrate layer 2; 9, a capacitor electrode of polysilicon formed on the capacitor insulating film 4; and G, a gate electrode of polysilicon formed on the gate oxide film 3. The p-type substrate layer 2 is connected to the substrate potential line 10 disposed in the same direction as that of the word line WL when the memory cells are arranged in a matrix form. The potential of the substrate potential line 10 is not fixed but can be time-selectively switched by the potential switching device Vbb in the semiconductor memory. This switching device Vbb is controlled in response to an address signal associated with, e.g., word line selection.

Figure 6:
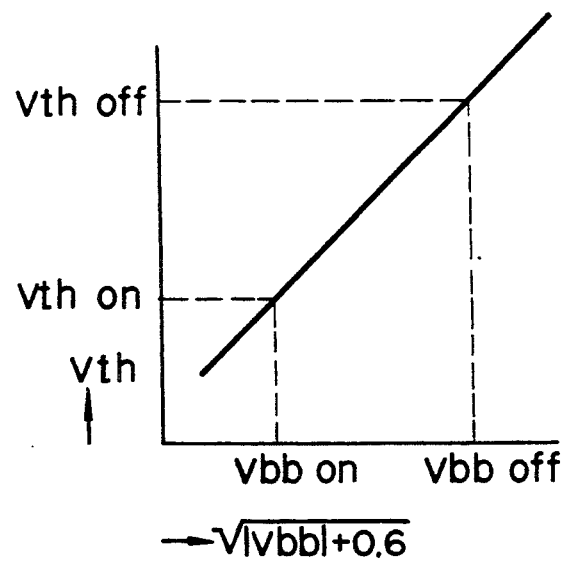
FIG. 6 a relationship of between a threshold voltage and a substrate potential of the MOS transistor shown in FIG. 5.

Since the substrate layer 2 of the MOS transistor is not connected to a fixed potential terminal, the above-mentioned memory cell can time-selectively switch and control the substrate potential of the MOS transistor. Therefore, the electric characteristic of the memory cell can be switched and controlled by a substrate bias effect either to avoid the Vth increase according to the bit line level or to be of an enhancement type or a depletion type which can prevent a threshold voltage loss. More specifically, the relationship between a threshold voltage Vth of the MOS transistor and its substrate potential Vbb is shown in FIG. 6. When a substrate potential Vbboff is applied to the substrate layer 2, the threshold voltage of the MOS transistor is set at Vthoff. When a substrate potential Vbbon (Vbboff < Vbbon) is applied to the substrate layer 2, the threshold voltage of the MOS transistor is set at Vthon.

Figure 7:
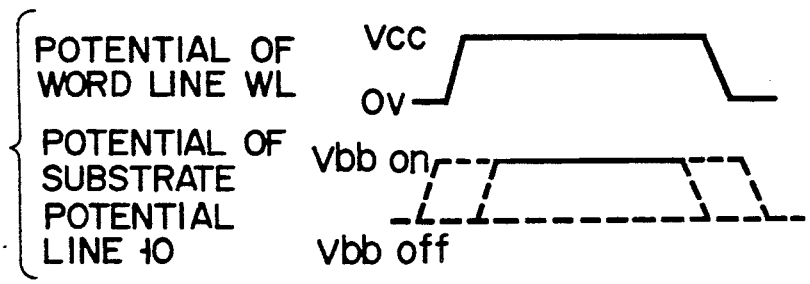
FIG. 7 is a relationship between a potential of a word line and that of a substrate potential line of the MOS transistor shown in FIG. 5.

In the semiconductor memory including an array wherein the above-mentioned memory cells are arranged in a matrix form, therefore, as shown in FIG. 7, when the potential of the substrate potential line 10 corresponding to a nonselected word line WL (0 V) is set at Vbboff, the MOS transistor of the memory cell connected to the substrate potential line 10 is set in an OFF state. When the potential of the substrate potential line 10 corresponding to the selected word line WL is set at Vbbon (a duration of Vbbon can be changed as indicated by a dotted line in FIG. 7), the MOS transistor of the memory cell connected to the substrate potential line 10 can be set in an ON state in which a threshold voltage loss is minimized or not generated (even if the WL power source voltage is Vcc.) In this case, if a high level of the bit line connected to the MOS transistor in the ON state is equal to the power source voltage Vcc, data can be written up to the level of the power source voltage Vcc of the memory cell with a simple WL bootstrap circuit or without WL bootstrap circuit. More specifically, when the Vthon is set to be depletion type, even if the limit level of the logical amplitude of the bit lines is used as an enable voltage of the word line, data can be written up to the limit level of the logical amplitude of the bit lines of the memory cell, and a word line booster is not required, thus improving the operation margin and reliability of the element Note that the present invention is not limited to the above-described embodiment, and when an SOI (silicon on insulator) technique is employed, a simpler memory can be realized More specifically, for example, as shown in FIG. 8, an element region isolated by an insulating layer 52 is formed on an insulating substrate 51. A p-type silicon substrate layer 53, a drain n-type impurity layer 54, and a source/electric charge storage n-type impurity layer 55 are formed in the element region. A gate oxide film 56 and a capacitor insulating film 57 are formed on the element region. A gate electrode G is formed on the gate oxide film 56, and a capacitor electrode 58 is formed on the capacitor insulating film 57. In the same manner as in the embodiment shown in FIGS. 4 and 5, a bit line BL, a word line WL, and a substrate potential line 10 are connected to the elements.

According to the embodiment shown in FIG. 8, the substrate layer 53 of the MOS transistor can be satisfactorily compact, and the substrate potential line 10 can be easily connected in to this case. Therefore, this transistor is suitable for high density memories.

Although a case wherein the substrate potential of the MOS transistor is directly switched and controlled has been described in the above-mentioned embodiments, the present invention is not limited to this case. The substrate layers 2 and 53 may be kept in a floating state, and the substrate potential may be switched and controlled by electrostatic capacitive coupling. For example, the electrostatic capacitive coupling between the word line and the substrate obtained by the gate capacitor of the MOS transistor can be utilized.

Another embodiment is shown in FIG. 9, and its equivalent circuit is shown in FIG. 10. More specifically, the memory cell shown in FIG. 9 is the same as that in FIG. 8 except that an n-type impurity layer 60 is formed in the insulating substrate 51 opposite to the p-type substrate layer 53 through the insulating layer 52, and the substrate potential line 10 is connected to the n-type impurity layer 60. In this case, the p-type substrate layer 53 opposes the n-type impurity layer 60 through the insulating layer 52, so that an electrostatic capacitor 61 shown in FIG. 10 is formed. However, other structures can be employed to form the electrostatic capacitor. For example, the n-type impurity layer 60 may be formed in the insulating layer 52, or a conductive layer may be formed on the substrate surface through an insulating film.

Although a planar type capacitor element is used in the above embodiments, other types of capacitor elements such as a trench type element can be used, and a p-channel type transistor can be used as a MOS transistor, as a matter of course.

What is claimed is:

1. A semiconductor memory comprising:
   a bit line and a word line;
   a substrate potential line;
   a memory cell including a capacitor element, and a MOS transistor having a drain, a source, a gate, and a back gate, one of said drain and said source being connected to said capacitor element, the other of said drain and said source being connected to said bit line, said gate being connected to said word line, and said back gate being connected to said substrate potential line; and
   a potential switching device, connected to said substrate potential line, for selectively switching a potential of said back gate of said MOS transistor.

2. A memory according to claim 1, wherein said potential switching device controls the potential of said back gate of said MOS transistor at every predetermined period of time so that said MOS transistor becomes an enhancement type or a depletion type which can prevent a threshold voltage loss.

3. A memory according to claim 1, wherein said MOS transistor comprises first and second impurity layers of a first conductivity type formed in a surface of a well region of a second conductivity type which is formed in a semicodncutor substrate of the first conductivity type, a gate insulating film formed on said well region and underlying said gate, and said capacitor element comprises a third impurity layer of the first conductivity type for electric charge storage, formed in said well region so as to be in contact with one of said first impurity layer and second impurity layer of said MOS transistor, a capacitor electrode located above said third impurity layer, and a capacitor insulating film interposed between said capacitor electrode and said third impurity layer.

4. A memory according to claim 1, wherein said MOS transistor comprises first and second impurity layers of a first conductivity type formed in a semiconductor region of a second conductivity type, said semiconductor region being formed in an insulating layer formed on an insulating substrate, and a gate insulating film formed on said semiconductor region, said gate being formed on said gate insulating film; and wherein said capacitor element comprises a capacitor insulating film formed on a portion of one of said first and second impurity layer, and a capacitor electrode formed on said capacitor insulating film, wherein said portion of one of said first and second impurity layers is used for storing an electric charge.

5. A memory according to claim 1, wherein said potential switching device is controlled by timing pulses for selecting said word line.

6. A memory according to claim 2 wherein said potential switching device is controlled by timing pulses for selecting said word line.

7. A memory according to claim 3, wherein said potential switching device is controlled by timing pulses for selecting said word line.

8. A memory according to claim 4, wherein said potential switching device is controlled by timing pulses for selecting said word line.

9. A memory according to claim 1, wherein said MOS transistor comprises first and second impurity layers of a first conductivity type formed in a semiconductor region of a second conductivity type, said semiconductor region being formed in an insulating layer formed on an insulating substrate, and a gate insulating film formed on said semiconductor region, said gate being formed on said gate insulating film; and wherein said capacitor element comprises a capacitor insulating film formed on a portion of one of said first and second impurity layers, and a capacitor electrode formed on said capacitor insulating film, wherein said portion of one of said first and second impurity layers is used for storing an electric charge, and a third impurity layer of the first conductivity type is formed in a surface of said insulating substrate in a position corresponding to said semiconductor region.

10. A semiconductor memory comprising:
    a bit line and a word line;
    a substrate potential line;
    a memory cell including a capacitor element, and a MOS transistor having a drain, a source, a gate, and a back gate, one of said drain and said source being connected to said capacitor element, the other of said drain and said source being connected to said bit line, said gate being connected to said word line, and said back gate being connected to said substrate potential line; and
    a potential switching device, connected to said substrate potential line, for selectively switching a potential of said back gate of said MOS transistor at predetermined periods of time so that said MOS transistors becomes one of an enhancement type and a depletion type which can prevent threshold voltage loss.

11. A semiconductor memory comprising:
    a bit line and a word line;
    a substrate potential line;

a memory cell including a capacitor element, and a MOS transistor having a drain, a source, a gate, and a back gate, one of said drain and said source being connected to said capacitor element, the other of said drain and said source being connected to said bit line, said gate being connected to said word line, and said back gate being connected to said substrate potential line; and a potential switching device, connected to said substrate potential line, for selectively switching a potential of said back gate of said MOS transistor at predetermined periods of time so that said MOS transistor becomes one of an enhancement type and a depletion type which can prevent threshold voltage loss, said potential switching device being controlled by timing pulses for selecting said word line.

* * * * *